(12) United States Patent
Chang et al.

(10) Patent No.: US 6,423,652 B1
(45) Date of Patent: Jul. 23, 2002

(54) POST-PROCESSING TREATMENT OF LOW DIELECTRIC CONSTANT MATERIAL

(75) Inventors: Ting-Chang Chang; Po-Tsun Liu, both of Hsinchu; Yi-Shien Mor, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/420,960

(22) Filed: Oct. 19, 1999

(51) Int. Cl.$^7$ .................... H01L 21/31; H01L 21/469
(52) U.S. Cl. .................... 438/782; 438/766; 438/778
(58) Field of Search .................... 438/766, 778, 438/782, 783

(56) References Cited

U.S. PATENT DOCUMENTS

| | | | | |
|---|---|---|---|---|
| 5,960,321 A | * | 9/1999 | Hsieh et al. | 438/699 |
| 6,133,137 A | * | 10/2000 | Usami | 438/622 |
| 6,156,671 A | * | 12/2000 | Chang et al. | 438/778 |
| 6,184,123 B1 | * | 2/2001 | Ge et al. | 438/624 |
| 6,284,677 B1 | * | 9/2001 | Hsiao et al. | 427/579 |

FOREIGN PATENT DOCUMENTS

JP          10-189724 A   *   7/1998

* cited by examiner

*Primary Examiner*—Carl Whitehead, Jr.
*Assistant Examiner*—Jamie L. Brophy

(57) ABSTRACT

A post-processing treatment of a low dielectric constant material. In the post-processing treatment, a shallow implantation is conducted to form a shallow compact layer over a dielectric film. This shallow compact surface layer acts as a barrier that prevents the absorption of moisture by the dielectric film. The shallow implantation is carried out using boron ions at an energy level of between about 10 and 50 keV and a dosage of between about $1 \times 10^{15}$ atm/cm$^2$ and $1 \times 10^{16}$ atm/cm$^2$.

2 Claims, 6 Drawing Sheets

POST-PROCESSING TREATMENT OF LOW DIELECTRIC CONSTANT MATERIAL

BACKGROUND OF THE INVENTION

1. Field of Invention

The present invention relates to a post-processing treatment of low dielectric constant material. More particularly, the present invention relates to the post-processing treatment of low dielectric constant material through an ion implantation.

2. Description of Related Art

As soon as semiconductor fabrication reaches the 0.25 μm line width stage, approximately 50% of transmission delay arc caused by resistance and capacitance (RC) along the metallic line that connects two transistors. Because delay between transistors is caused by the product of resistance (R) in the metallic line and capacitance (C) of the dielectric layer, there are two principle methods of reducing transmission D delay. The first method is to use a low resistance metal to fabricate the interconnection lines. The second method is to use a low dielectric constant material to insulate the metallic lines. To reduce resistance in metallic lines, copper (having resistivity of 1.7-μΩcm) is gradually replacing the metallic material aluminum (having resistivity of 2.7-μΩcm). To combat increased parasitic capacitance resulting from intensified narrow width effect, dielectric materials having a low dielectric constant arc needed.

Dielectric layers that are deposited in a later stage of semiconductor production usually demand high reliability, low stress, simplicity in manufacturing, low water absorption and case of integration with multiple conductive lines. In the past, most dielectric layers were formed by depositing silicon dioxide ($SiO_2$) using a plasma-enhanced chemical vapor deposition (PECVD) process. The silicon dioxide layer so formed usually has a dielectric constant of around 3.9. Another type of commonly used dielectric material is a silicon dioxide based ($SiO_2$-base) inorganic compound. The inorganic material generally has a dielectric constant greater than 3.0. However, as sub-micron devices are produced, the dielectric constant of the dielectric layer must be lowered correspondingly in order to back up the properties demanded. Otherwise, working speed of devices will be seriously affected, while power consumption and cross talk between neighboring devices will increase, as well.

Recently, a high molecular weight organic compound known as methylsesquioxane (MSQ) has been developed especially for forming dielectric layers. The MSQ compound can be spin-coated onto a substrate surface. FIG. 1A is a sketch showing a 'cage' structure of a portion of a MSQ molecule. FIG. 1B is a sketch showing a 'net' structure of a portion of a MSQ molecule. As shown in FIG. 1A and 1B, the compound MSQ is a silicon based (Si-base) substrate with methyl ($CH_3$) radicals attached to the silicon atoms. Due to the presence of carbon, the MSQ compound has a porous structure. The porous structure makes the dielectric constant of a MSQ film rather low. In addition, of the high molecular weight organic dielectric materials, MSQ has relatively good heat stability. Since a MSQ dielectric layer is also relatively easy to form, the MSQ compound is likely to be widely used in the future.

However, the porous structure of MSQ compound may also lead to the absorption of moisture from the surrounding atmosphere. Since water is a polar material having a dielectric constant of about 78, the dielectric constant of an MSQ film may increase considerably when only a very small amount of moisture is absorbed. This water-absorption character also appears in other types of dielectric material having similar configuration such as hydrogen silsesquioxane (HSQ).

SUMMARY OF THE INVENTION

The present invention provides a post-processing treatment of a low dielectric constant material, which treatment is capable of reducing moisture absorption so that the low dielectric constant can be maintained. Consequently, a thin dielectric film of the low dielectric constant material can be used to insulate multiple conductive lines so that operating speed of integrated circuits is increased while power consumption of the circuits is reduced.

To achieve these and other advantages and in accordance with the purpose of the invention, as embodied and broadly described herein, the invention provides a post-processing treatment for a low dielectric constant material. The post-processing treatment includes a shallow implantation of the dielectric material to form a thin compact surface layer. This thin compact surface layer acts as a barrier preventing the absorption of moisture by the dielectric layer.

According to one embodiment of this invention, boron ions at an energy level of between about 10 and 50 keV and a dosage of between about $1 \times 10^{15}$ atm/cm$^2$ and $1 \times 10^{16}$ atm/cm$^2$ are used in the shallow implantation. Preferably, the energy level is 20 keV and the dosage level is $5 \times 10^{15}$ atm/cm$^2$.

According to another embodiment of this invention, the post-processing treatment can be applied to an organic dielectric material layer such as a MSQ film or an inorganic dielectric material layer such as a HSQ film.

According to yet another embodiment of this invention, after the step of performing a shallow implantation of the low dielectric constant material, the treatment further includes performing an annealing operation for reducing the damages in the film structure caused by implanted ions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
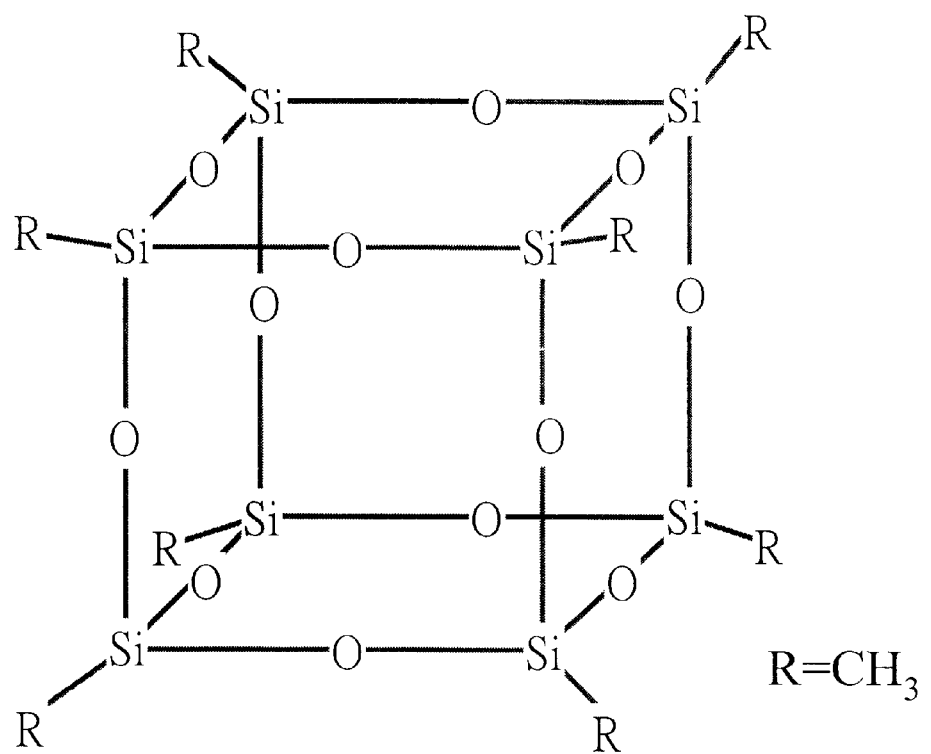
FIG. 1A is a sketch showing a 'cage' structure of a portion of MSQ molecule.
Figure 1B:
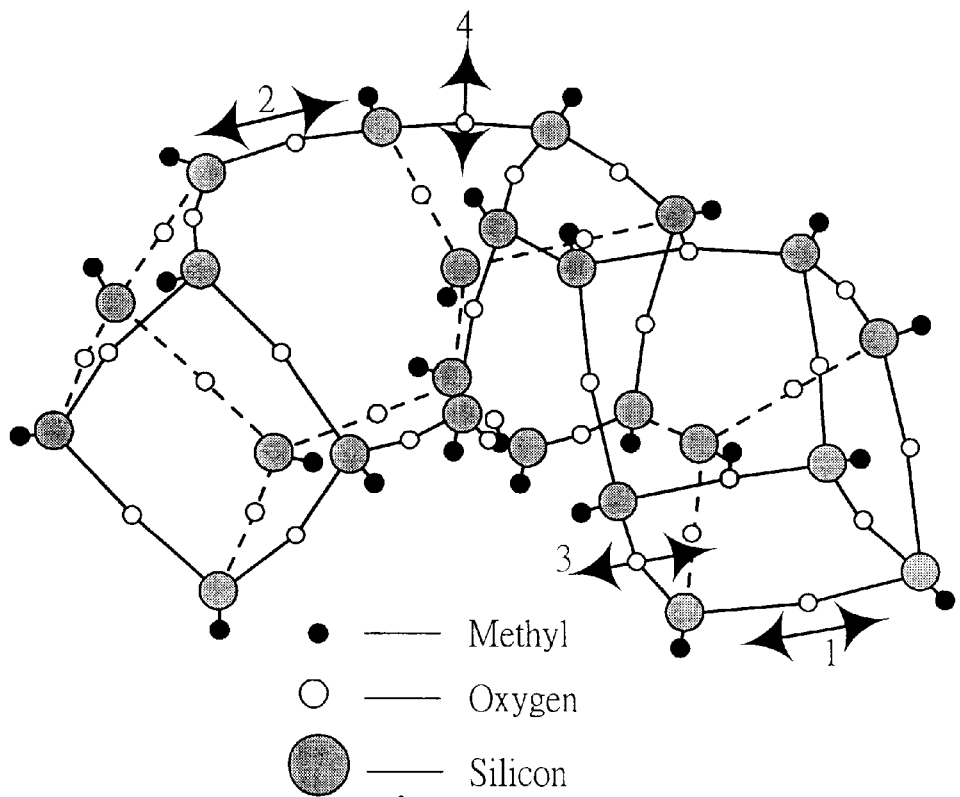
FIG. 1B is a sketch showing a 'net' structure of a portion of MSQ molecule.

Reference will now be made in detail to the present preferred embodiments of the invention, examples of which are illustrated in the accompanying drawings. Wherever possible, the same reference numbers are used in the drawings and the description to refer to the same or like parts.

In the embodiment of this invention, an MSQ specimen is fabricated to illustrate the post-processing treatment of low dielectric constant material. In practice, the low dielectric constant material is formed as an inter-layer dielectric or an inter-metal dielectric layer. Furthermore, aside from a MSQ film, the same processing treatment can be applied not only to other types of low dielectric constant but also to moisture absorbing films (for example, a HSQ film).

Figure 2A:
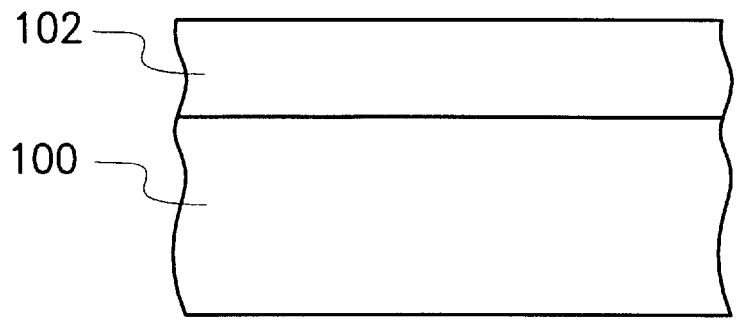
FIGS. 2A through 2D are schematic cross-sectional views showing the steps for treating a low dielectric constant layer.
Figure 2B:
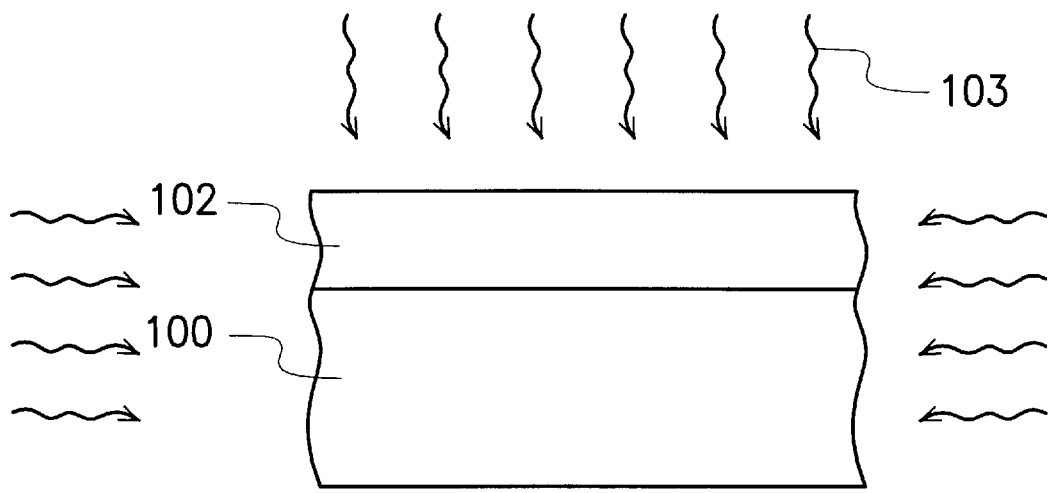

FIGS. 2A through 2D are schematic cross-sectional views showing the steps for treating a low dielectric constant layer. First, as shown in FIGS. 2A and 2B, MSQ solution is dropped onto the upper surface of a silicon chip 100. The silicon chip 100 is placed in a spinner and spun at 3000 rpm for about 20 seconds so that a uniform MSQ film 102 is coated over the silicon chip 100. The silicon chip 100 is placed on a hot plate and baked at a temperature of about 180° C. for 2 minutes. Temperature is raised to about 250° C. and the silicon chip 100 is further baked for one more minute so that all the solvent is driven away. The MSQ film 102 is cured by placing the silicon chip 100 inside a furnace heated to a temperature of 400° C. for 30 minutes. After the curing process (label 103 in FIG. 2B), bonds within the MSQ film 102 are reinforced.

Figure 2C:
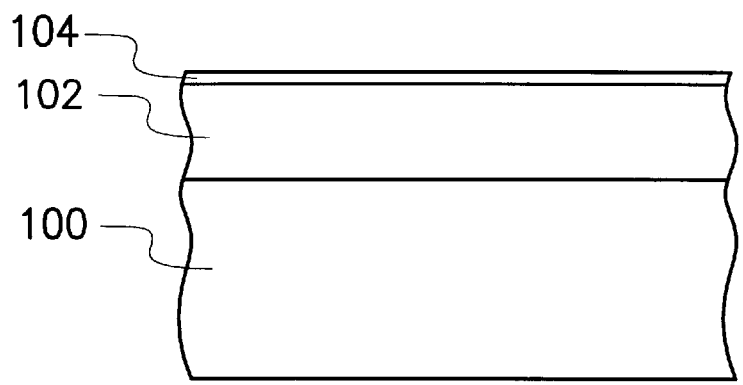

As shown in FIG. 2C, a shallow implantation of the cured MSQ film 102 is carried out so that a compact layer 104 is formed near the surface of the film 102. The shallow implantation can be carried out using boron, for example. Boron ions can be implanted into the film 102 at an energy level of between about 10 keV and 50 keV and a dosage level of between about $1\times10^{15}$ atm/cm$^2$ and $1\times10^{16}$ atm/cm$^2$. Preferably, the energy level is 20 keV and the dosage level is $5\times10^5$ atm/cm$^2$. In the presence of a compact layer 104, moisture is kept away from the film interior.

To prevent the ions from damaging the internal structure of the MSQ film 102 and thus raising the dielectric constant of the layer, the smallest possible ion implantation energy level is selected so that the implanted depth is shallow. Using the implantation conditions stated in the embodiment of this invention, only a superficial layer 104 is formed over the MSQ film 102. A large portion of the MSQ, film 102 beyond the compact layer 104 remains structurally intact.

To obtain better results, lighter molecular weight ions such as hydrogen ions instead of boron may be used for implanting low dielectric constant films such as a HSQ film.

An annealing operation may be conducted after the ion implantation to reduce as much structural damage to the film as possible. For example, the silicon chip 100 is heated to a temperature of between about 350 and 450° C. (preferably 400° C.) and maintained there for 30 minutes.

Figure 2D:
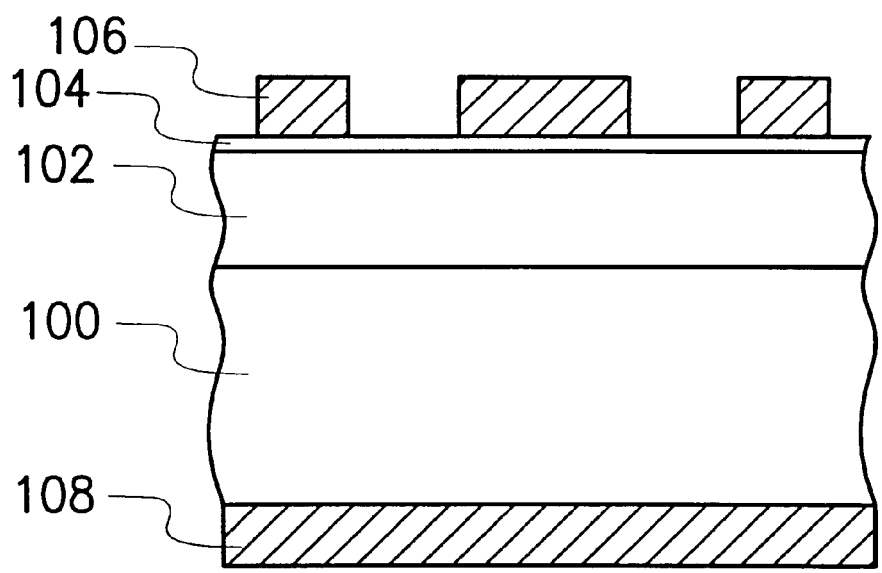

As shown in FIG. 2D, a metallic pattern 106 and a metallic layer 108 are formed over the compact layer 104 and the back surface of the silicon chip 100, respectively, to complete the MSQ specimen production.

Figure 3:
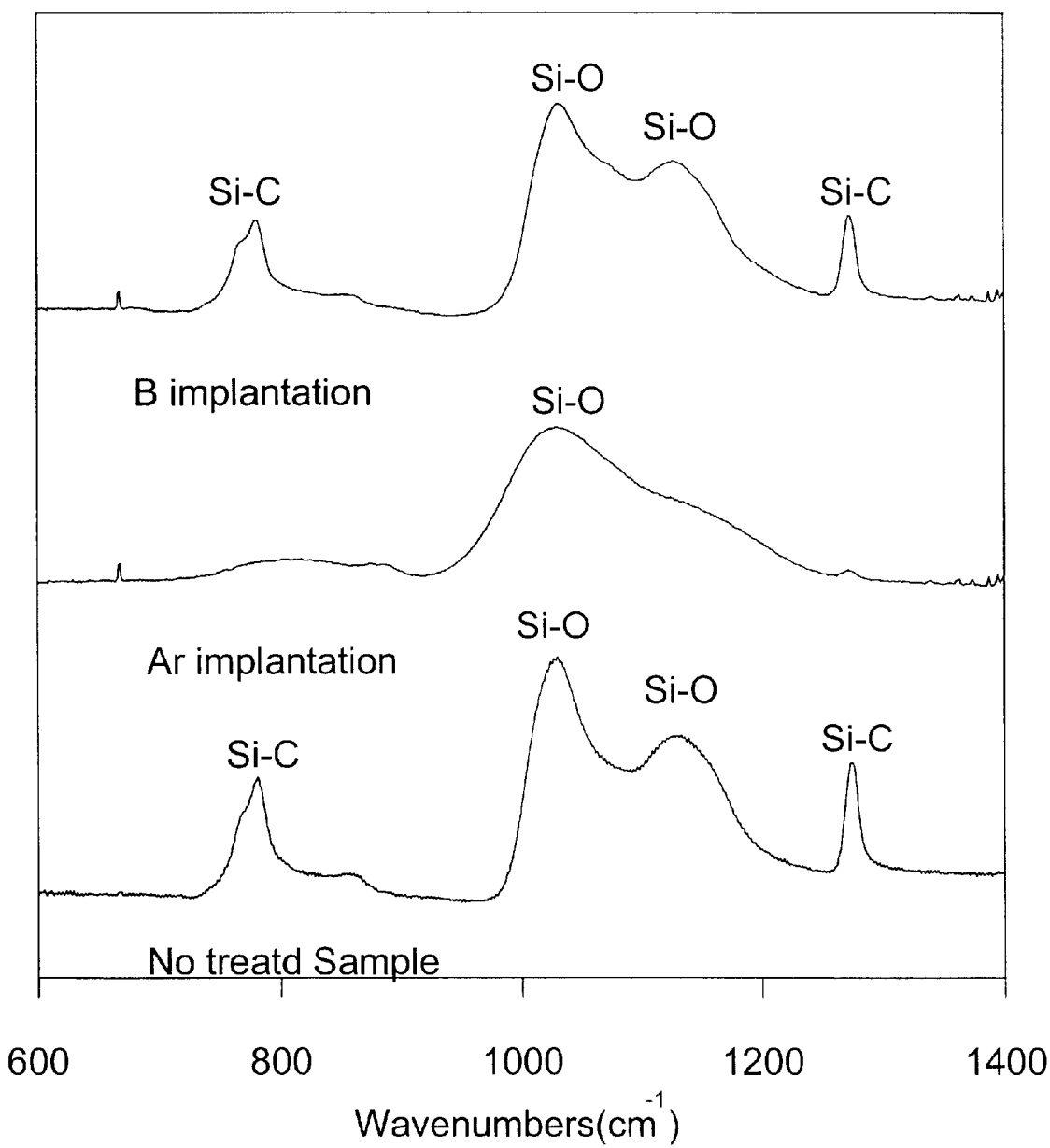
FIG. 3 is a Fourier transformation infrared (FTIR) spectrum analysis of a MSQ film after various implantation treatments, which shows its bonding states.

In the embodiment of this invention, a shallow implantation is used to treat the MSQ film after its formation. By performing a shallow implantation, a protective compact layer is formed over the surface of the MSQ film without damaging the internal structure of the film. To compare the effects of different types of ions on the results of a shallow implantation treatment, results obtained by implanting argon ions is also shown. FIG. 3 is a Fourier transformation infrared (RTIR) spectrum analysis of a MSQ film, showing its bonding states. The different effects on a MSQ film of a boron implantation and an argon implantation can be clearly observed in FIG. 3. Spectrum obtained from an FTIR analysis of the MSQ film is almost the same both before and after the boron implantation. However, the peak at 800 cm$^{-1}$ (Si—C bond) disappears after the argon implantation, indicating that Si—C bonds are broken.

Figure 4:
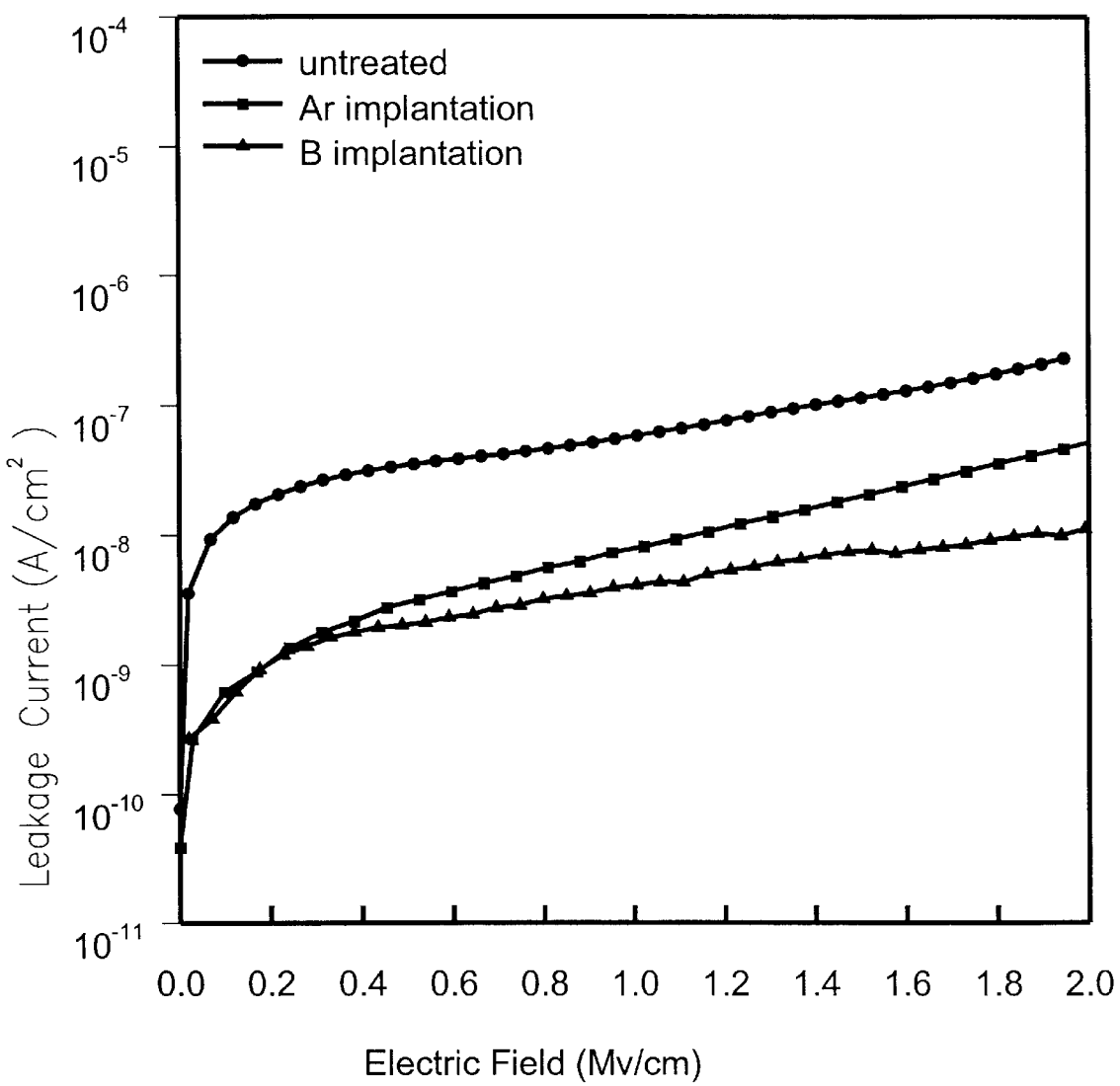
FIG. 4 is a plot of the leakage current of a MSQ film after various implantation treatments versus an applied field.

FIG. 4 is a plot of the leakage current of a MSQ film versus an applied field. As shown in FIG. 4, leakage current is reduced considerably when boron is implanted into the MSQ film to form a shallow compact layer.

Figure 5:
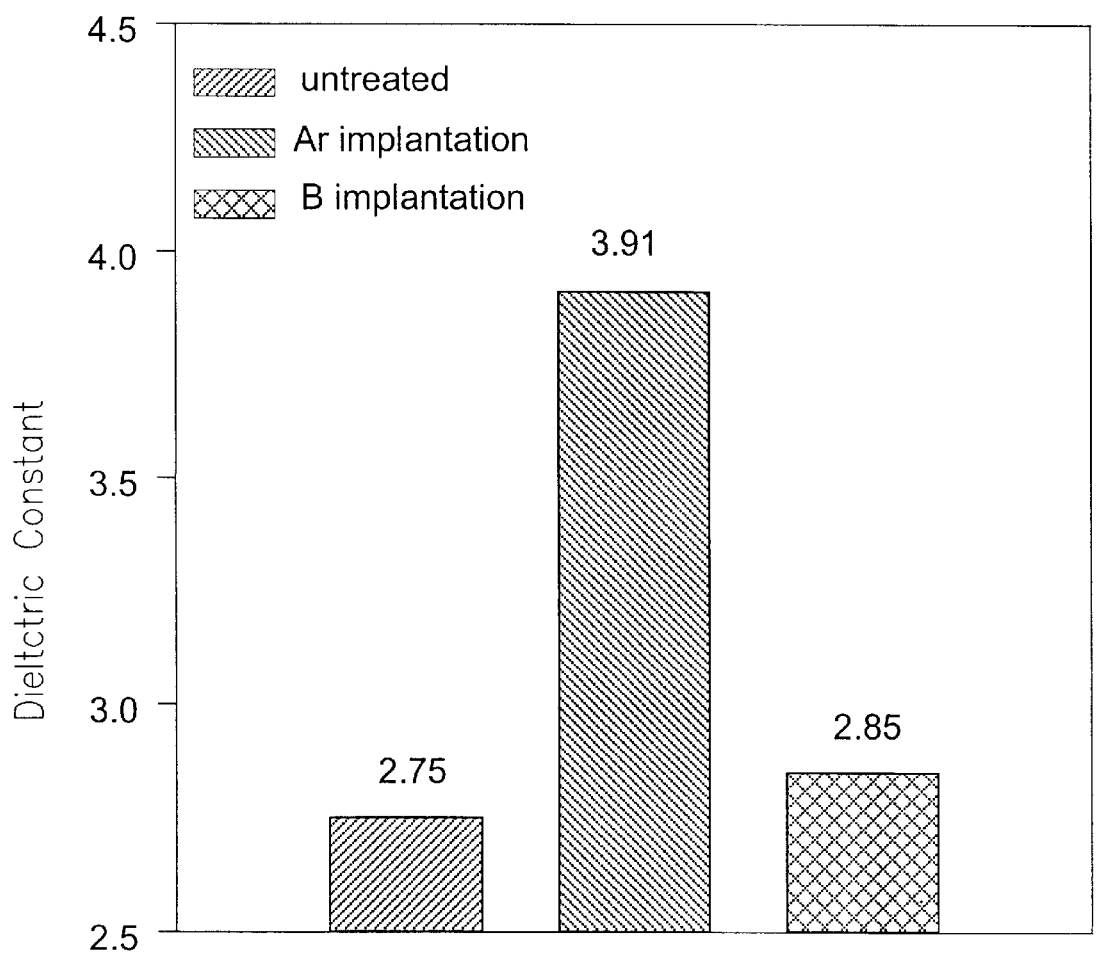
FIG. 5 is a bar chart comparing the dielectric constant of MSQ films, each treated by a different process.

FIG. 5 is a bar chart comparing the dielectric constant of MSQ films each treated by a different process. As shown in FIG. 5, the dielectric constant of a boron-treated MSQ film is only slightly modified (still very close to an untreated MSQ film). In contrast, the dielectric constant of an argon-treated MSQ film rises to a higher value. Hence, a boron treatment causes only minor disruption to the internal structure of a MSQ film, and a low dielectric constant can be maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A post-processing treatment of dielectric layer, comprising:

forming a dielectric layer over a substrate;

implanting dopants into the dielectric layer to form a compact layer on the surface of the dielectric layer, wherein implanting dopants into the dielectric layer includes implanting hydrogen ions; and after implanting dopants into the dielectric layer, performing an annealing operation.

2. A post-processing treatment of dielectric constant material that can be applied to the fabrication of semiconductors, comprising:

forming a cured dielectric layer over a substrate;

implanting dopants into the cured dielectric layer to form a compact layer on the surface of the cured dielectric layer; and after implanting dopants into the cured dielectric layer, performing an annealing operation.

* * * * *